United States Patent
Chu et al.

(10) Patent No.: US 6,751,775 B2
(45) Date of Patent: Jun. 15, 2004

(54) TAP-SELECTABLE REDUCED STATE SEQUENCE ESTIMATOR

(75) Inventors: Lichung Chu, San Diego, CA (US); Thomas Klingenbrunn, San Diego, CA (US); Benny Vejlgaard, San Diego, CA (US); Antoine J. Rouphael, Escondido, CA (US)

(73) Assignee: Siemens Information and Communication Mobile, LLC, San Diego, CA (US)

( * ) Notice: Subject to any disclaimer, the term of this patent is extended or adjusted under 35 U.S.C. 154(b) by 426 days.

(21) Appl. No.: 09/990,633

(22) Filed: Nov. 21, 2001

(65) Prior Publication Data

US 2003/0106015 A1 Jun. 5, 2003

(51) Int. Cl.⁷ .................. H03M 13/03; H04L 27/06
(52) U.S. Cl. .............. 714/795; 714/792; 375/233; 375/262; 375/265; 375/341
(58) Field of Search ................. 714/795, 794, 714/796, 792; 375/229, 232, 233, 262, 263, 264, 265, 325, 326, 340, 341, 346, 348; 708/323

(56) References Cited

U.S. PATENT DOCUMENTS

| | | | | |
|---|---|---|---|---|
| 5,150,381 A | * | 9/1992 | Forney et al. | 375/261 |
| 5,402,445 A | | 3/1995 | Matsura | 375/229 |
| 5,546,430 A | * | 8/1996 | Liao et al. | 375/341 |
| 6,356,586 B1 | * | 3/2002 | Krishnamoorthy et al. | 375/233 |
| 6,477,200 B1 | * | 11/2002 | Agazzi et al. | 375/233 |

OTHER PUBLICATIONS

M. Vedat Eyuboglu and Shahid U.H. Qureshi, Reduced–State Sequence Estimation with Set Partitioning and Decision Feedback, IEEE Transactions on Communications, Jan. 1988, pp. 13–20, vol. 36, No. 1.

Alexandra Duel–Hallen and Chris Heegard, Delayed Decision–Feedback Sequence Estimation, IEEE Transactions on Communications, May 1989, pp. 428–436, vol. 37, No. 5.

* cited by examiner

Primary Examiner—Emmanuel L. Moise

(57) ABSTRACT

A method of determining a trellis from a sequence of n symbols in a Viterbi detector. The method includes the steps of receiving a sequence of n symbols, defining partitioned sets according to a decision tree structure, and determining size of each set partitioning according to tap energy of the channel. The method also includes steps of determining a reduced set of connection paths between the current layer and a destination layer in the trellis by determining a value of a most likely oldest partitioned set in a current layer; and calculating branch metrics only for the current layers in the trellis in which the oldest partitioned set matches the determined value.

13 Claims, 4 Drawing Sheets

TAP-SELECTABLE REDUCED STATE SEQUENCE ESTIMATOR

BACKGROUND OF THE INVENTION

The present invention relates generally to a sequence estimator such as a Viterbi equalizer suitable for data detection in time dispersive wireless channels in particular with a large symbol set, for example, 8 character symbols.

Sequence estimators, such as Viterbi detectors are used for decoding intersymbol interference channels for digital communication. In decoding an intersymbol interference channel, maximum likelihood sequence estimation, implemented with a Viterbi detector, has a significant performance gain compared to other detection techniques. However, the implementation complexity of maximum likelihood sequence estimation is generally larger than other detection techniques, and the increase in complexity could present a challenge for low-power and high-speed implementation. It is therefore desirable to reduce the implementation complexity of the Viterbi detector at the expense of a reasonable, preferably negligible, performance loss compared to maximum likelihood sequence estimation.

A Viterbi detector implements the maximum likelihood sequence estimation with a recursive approach. The complexity of the Viterbi detector, in other words the number of states in the trellis, which shows the transition from multiple previous states to multiple current states, is given as a symbol alphabet raised to the length of the channel memory. This length is equal to $X^K$, where X is number of different characters per symbol and K the number of symbols in a trellis code. Within an environment with X=2, such as a direct digital representation in which one character, for example "−1", represents a digital zero and one character, for example "1", represents a digital one, the complexity is limited and up to 5 symbols per trellis code will not cause a big burden on a signal processor. However, faster standards require more different characters per symbol. For example, X=8 could be a possible number of characters per symbol in a high speed application. Other higher numbers for X are possible to increase transmission speed. For example, for X=8 in a 6-tap Viterbi equalizer the number of states in the trellis would become $8^5$=32768.

A delayed decision feedback sequence estimator (DDFSE) is a known technique to reduce the number of states in the trellis by canceling the inter-symbol interference (ISI) based on the tentative decision on the older symbols in the tapped delay line. However, the DDFSE can give poor performance in cases where the channel energy extends outside the DDFSE memory. One way to combat this problem is by applying pre-filtering which results in a minimum-phase system. However, this creates additional noise and computational load and may result in numerical instability.

The reduced-state sequence estimator with set partitioning (RSSE/SP) is a known technique to reduce the number of states in the trellis by removing paths which correspond to less likely data sequences given the received signal. In contrast to other reduced-state algorithms such as the above mentioned DDSFE, the RSSE/SP improves the performance/complexity ratio by utilizing geometry information in the symbol constellation. However, due to error propagation, the RSSE/SP can give poor performance in cases where the channel impulse response has a pre-cursor portion, which means that the first path is not the strongest path. This situation might happen while traveling in urban area, or for data detection when the training sequence is in the middle of a burst, such as in certain wireless standards. Although a pre-filter can reshape the channel impulse response, the pre-filter however enhances the noise, increases computational load, and may result in numerical instability.

It is therefore an object of the present invention to provide a sequence estimator that overcomes the above mentioned problems.

SUMMARY OF THE INVENTION

According to a specific embodiment, the present invention provides a method of determining a trellis for a Viterbi detector based on estimated tap energy of the channel. The method includes the steps of receiving a sequence of n symbols, defining partitioned sets according to a decision tree structure, and determining size of each set partitioning according to tap energy of the channel. The method also includes the step of determining a reduced set of connection paths between the current layer and a destination layer in the trellis by determining a value of a most likely oldest partitioned set in a current layer, and calculating branch metrics only for the current layers in the trellis in which the oldest partitioned set matches the determined value. According to a more specific embodiment, the step of defining the partitioned sets for each symbol according to a decision tree can be dependent on the channel coefficients of the symbol sequence.

A more complete understanding of this and other specific embodiments of the present invention and advantages thereof may be acquired by referring to the following description taken in conjunction with the accompanying drawings, in which like reference numbers indicate like features.

DETAILED DESCRIPTION OF THE SPECIFIC EMBODIMENTS

The present invention relates generally to a sequence estimator such as a Viterbi equalizer suitable for data detection in time dispersive wireless channels in particular with a large symbol set, for example, 8 character symbols. The present invention can be used in wireless phone and base station data receivers to enhance system performance and reduce computational complexity. The present invention can be useful in EDGE (Enhanced Data rates for GSM Evolution) systems. Preferably the arrangement of the present invention can be implemented within a digital signal processor or an ASIC.

Figure 1:
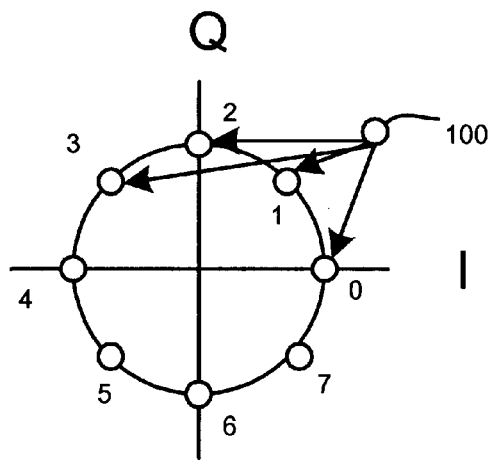
FIG. 1 shows an I/Q graph of a single symbol which can adopt one of 8 possible characters in an 8-PSK modulation.

FIG. 1 shows the eight possible characters in exemplary 8-PSK modulation as widely used, for example, in the wireless transmission standard GSM. A received signal will be identical with one of the 8 characters 0–7 in an ideal transmission channel with no intersymbol interference and no noise. However, in reality a transmitted signal will be altered through a variety of influences known as the channel characteristics and through the addition of noise. Thus, such a "real" signal will more likely look like a received symbol 100 in FIG. 1. To evaluate what the true value of the received symbol is, this symbol 100 has to be compared with all possible characters 0–7. The closest vector to received symbol 100 will be determined as the most likely character. FIG. 1 shows only four vectors for a better overview. However, the closest vector does not have to lead to the actual transmitted symbol, as previously transmitted symbols can have a more or less significant influence on the actual transmitted symbol.

A common Viterbi detector takes this effect into account and therefore analyzes a sequence of symbols. To evaluate which sequence is the most likely, all possible combinations have to be evaluated. Thus, assuming a symbol sequence of K=3 symbols, wherein each can adopt X=2 character, would generate a moderate number of possible sequences, namely eight different symbol sequences. A Viterbi equalizer analyzes the transitions of all states of the previous K-1 symbols and reduces them to $X^{K-1}$ states. The number of states is thus defined as $X^{K-1}$. However, with a sequence of 6 symbols and a character alphabet of 8, the number increases dramatically as described above. The Reduced State Sequence Estimator with Set Partitioning (RSSE/SP) reduces the burden on a digital signal processor dramatically.

To this end, so-called subsets are formed. Each state in a Viterbi equalizer can be written as $p_k=[x_{n-1}, x_{n-2}, \ldots, x_{n-K}]$, where $x_n$ is the nth transmitted symbol. The RSSE/SP method defines partitioned sets of $x_{n-k}$ as $J_k$, whose size is $|J_k|$ for k=1, ..., K. The set partitioning of $J_k$ is denoted as $\Omega(k)$. An Ungerboeck partition tree for 8-PSK modulation is shown in FIG. 2, which follows the rules:

(A) $|J_p|=>|J_q|$, for p<q;

(B) any set in $\Omega(k-1)$ is a subset of $\Omega(k)$; and (C) $|J_1|<=|X|$.

Figure 2:
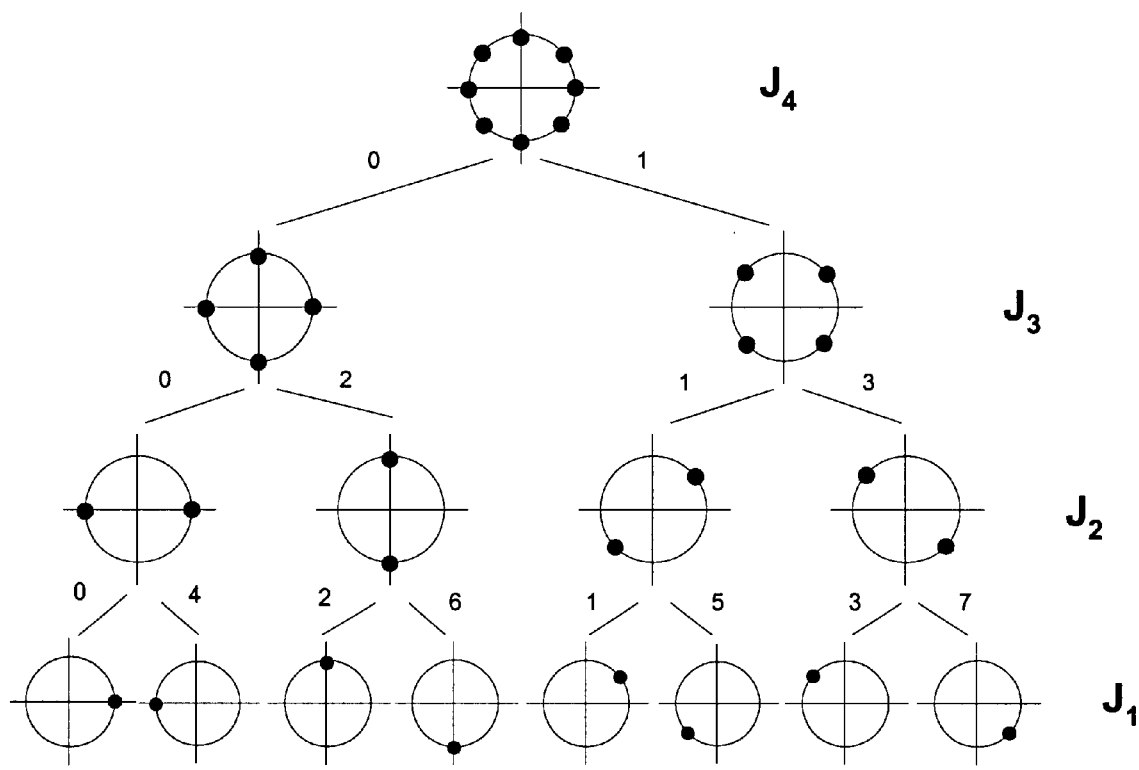
FIG. 2 shows an Ungerboeck partition tree.

Thus, each $J_n$ shown in FIG. 2 defines the possible states for this reduced subset. $J_n=8$ encompasses the whole set, namely states 0–7. Therefore, $J_n=8$ corresponds to a normal Viterbi equalizer for an 8-PSK modulation. $J_n=4$ reduces the possible states from 8 to 4, namely states 0–3. In a RSSE/SP, using $J_n=4$, four decisions are pre-decided. For example, in state 0 of $J_n=4$, it has been pre-decided whether the received symbol refers to character 0 or 4. In other words, there is no separate probability calculated for the characters 0 and 4. Any decision is left open for $J_n=8$. In this case, probabilities for all characters are calculated. Even more reduction can be seen in $J_n=2$ as only two states are left, namely 0 and 1. In case of $J_n=1$ an absolute decision would be made with respect to what character the received symbol most likely represents.

Figure 4:
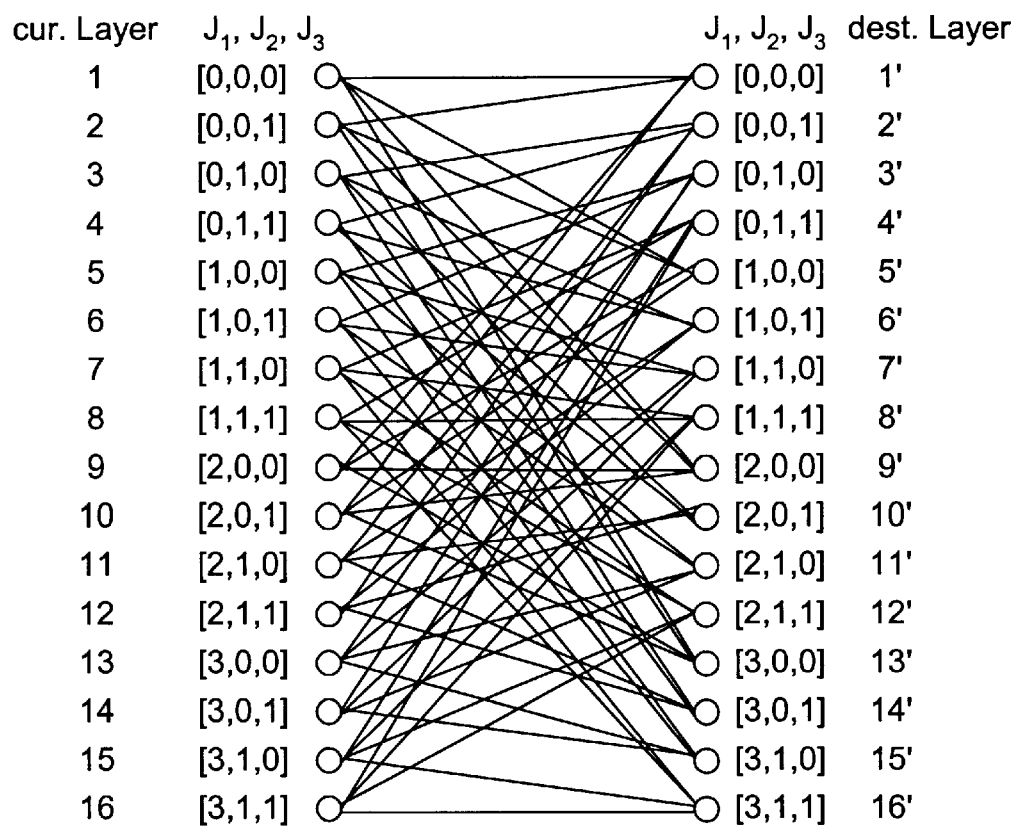
FIG. 4 shows a subset trellis for an 8-PSK modulation with all transitions.

FIG. 4 shows a typical reduced state sequence estimator. This estimator shows 16 different states 1–16 determined by $J_1$, $J_2$, and $J_3$, which transition into 16 new states 1'–16'. It should be noted that the oldest symbol in the sequence is represented in $J_3$. The number of path metrics is clearly reduced compared to a conventional Viterbi Equalizer (VE). However, this might still put a burden on a signal processor.

Figure 3:
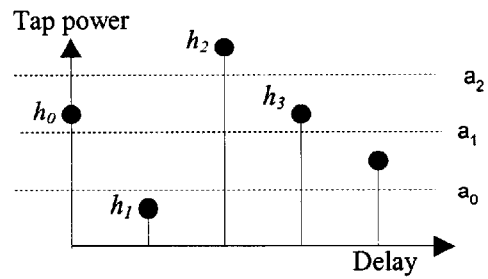
FIG. 3 shows a graph of an example of channel power distribution over time associated to four consecutive symbols.

FIG. 3 shows a typical channel realization with symbol-rate sampling and a channel length of K=3. The number of sets is determined following the rules described below:

(D) For the tap power, set one or a couple of thresholds, $a_0$, $a_1$, $a_k$, $k \leq K-1$. That is, the number of thresholds should not be more than enough to discriminate the layers in FIG. 2.

(E) Higher tap power requires larger $|J_p|$ in order to accommodate more tentative decisions for the corresponding symbol when computing the cost function of the trellis.

(F) Not to violate Rules (A)–(C), especially the rule (B).

Basically, Rule (E) assures that the inter-symbol interference (ISI) is calculated based on more tentative decisions of the interfering symbol if that symbol's present power is high. Hence, the probability is low for calculating the cost function based on a wrong tentative decision on the interfering symbol with high power. As mentioned above, the wrong decision on interfering symbol with high power would significantly change the cost function. Furthermore, Rule (A) has to be satisfied since the merged elements cannot be divided again without causing confusion in constructing the trellis.

Based on Rules (D)–(F), the following procedure is developed to determine the number of states $|J_p|$:

Procedure #1:

Decide the maximum number of sets, say $N_{max}$, and the thresholds $a_0$, $a_1$, .... Then, the number of sets for each tap will be predetermined (excluding ho, since ho only affects the number of paths between the states, not the number of states):

Tap power below $a_0$: assign 1 state

Tap power between $a_0$ and $a_1$: assign 2 states

Tap power between $a_1$ and $a_2$: assign 4 states

. . . .

Tap power above $a_{K-1}$: assign $N_{max}$ states.

To prevent violation of Rule (A), the pre-determined number of states have to be modified, namely to:

For Tap=K to 2 step (−1)

If (Number of state for (Tap−1)<Number of state for Tap)

Number of state for (Tap−1)=Number of state for Tap

For example, during a burst transmission the channel characteristics usually do not change. Thus, if the channel characteristics are known, a specific suited sequence of partitioned sets $J_n$ is selected to be analyzed by the Viterbi equalizer. As an example the partition of 8-PSK modulation in FIG. 2 is taken together with channel realization in FIG. 3. Based on the procedure above and decision on $N_{max}$ equal to 8, for example, the selected number of sets would be $|J_1|=|J_2|=8$, $|J_3|=4$, and $|J_4|=2$. The oldest symbol in the sequence $x_{n-3}$ has been transmitted with the channel characteristics $h_3$, $x_{n-2}$ transmitted with $h_2$, $x_{n-1}$ transmitted with $h_1$, and $x_n$ transmitted with $h_0$. The partitioned set $J_1$ therefore evaluates $x_{n-3}$, $J_2$ evaluates $x_{n-2}$, $J_3$ evaluates $x_{n-1}$, and $J_4$ evaluates $x_n$.

With instantaneous power of certain channel taps that are below a predefined threshold $a_0$, a tentative decision on the corresponding symbol may be used to eliminate calculation of the branches initializing from some of the $p_n$'S while receiving $x_n$. The procedure is detailed in the following:

Procedure #2:

1. It has to be recalled that the beginning and terminating states at t=n is $p_{n-1}=[x_{n-1}, x_{n-2}, \ldots, x_{n-K}]$ and $p_n=[x_n, x_{n-1}, \ldots, x_{n-K+1}]$. The tentative decision on $x_{n-K}$ corresponds to the survivor path with minimum cost going to any of the states $p_n$ on layer n. The cost (accumulated path metric) is determined as $$E_N = \sum_{n=1}^{N} e_n = \sum_{n=1}^{N} \|r_n - \sum_{k=0}^{K-1} \hat{h}_k x_{n-k}\|^2 \quad (1)$$

where $r_n$ is the received signal, $\hat{h}_k$ is the estimated channel coefficient provided by channel estimators, and $x_n$ is the symbol.

2. For those symbols corresponding to tap power below $a_0$ the path metric will be predetermined in the calculation of Eqn. (1). This would exclude some of the states as beginning states and/or paths originating from some of the states, when calculating the cost functions.
3. Among the costs calculated in Step 2, the smallest one and its corresponding value for $x_{n-K}$ has to be determined.
4. Re-population: Calculate cost for all the paths originating from the states corresponding to $x_{n-K}$ found in Step 3. This step is essential to guarantee that each destination state has at least one path terminated at it. Thus, at t=n+1 the trellis maintains a full set of starting states.
5. Repeat the process for t=n+1.

Figure 5:
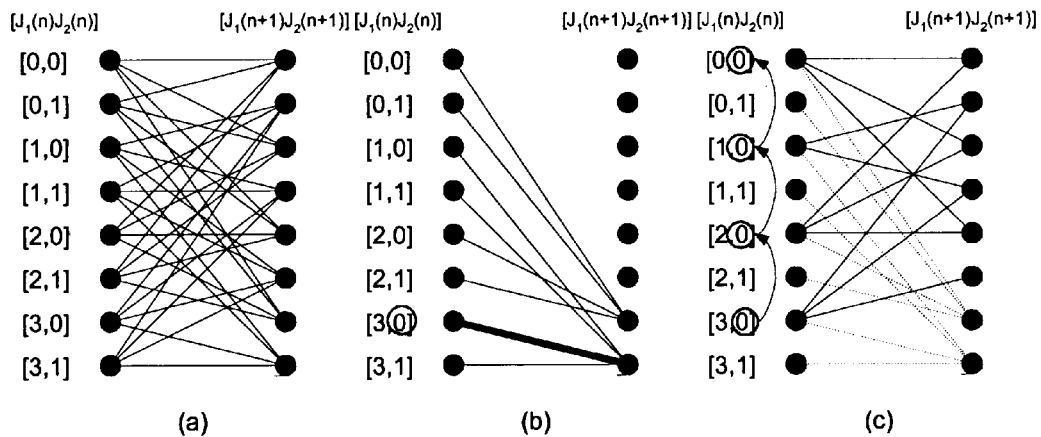
FIGS. 5A–5C show the trellis code determination in a Viterbi detector according to one embodiment of the present invention.
Figure 6:
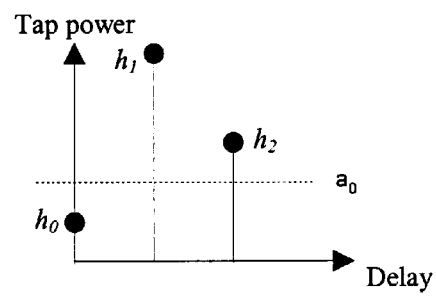
FIG. 6 shows a graph of an example of channel power distribution over time.

FIG. 5 shows as a first example the above method in accordance with the channel response shown in FIG. 6 with 3 taps and the set partitioning in FIG. 2. For illustration purposes, it is assumed that the following symbols are transmitted: $[x_{n-2}, x_{n-1}, x_n] = [1, e^{j7\pi/4}, e^{j7\pi/4}]$.

Based on Procedure #2, the following steps are executed:
1. Decide the number of states: to facilitate clear presentation in limited space, we set $|J_1|=4$, which means the RSSE/SP has to make non-delayed decision of $x_n$ in each $J_1$ set. Since power of $h_2$ is less than that of $h_1$, $|J_2|=2$ may be selected without violating rules (D)–(F).
2. At t=n, $r_n$ is at the input of the equalizer and the cost function $E_N$ has to be calculated. Since the first tap $h_0$ is below threshold $a_0$, only the paths corresponding to tentative decision on $x_n$ denoted by $\hat{x}_n$ ($\hat{J}_1=3$ in FIG. 5(b)) are applied. As mentioned above, the probability of successfully detecting $x_{n-2}$ does not rely heavily on $\hat{x}_n$ since $h_0$ is small.
3. Among all paths calculated in Step 1, the path with the smallest accumulated cost will be selected (marked by a thick line in FIG. 4(b)). Based on this survivor path, it is tentatively decided $\hat{x}_{n-2}=1$ (i.e., $\hat{J}_2$ (n)=0). In addition to the paths calculated in Step 1, all paths originating from states with $\hat{J}_2$ (n)=0 are calculated as shown in solid lines in FIG. 5(c). This step was mentioned before as "re-population".
4. Repeat steps 2 to 3 for the states in the next layer of trellis (i.e., t=n+1).

In comparison to the conventional VE in FIG. 4, the complexity mentioned above is reduced with the specific embodiment of the present invention.

Figure 7:
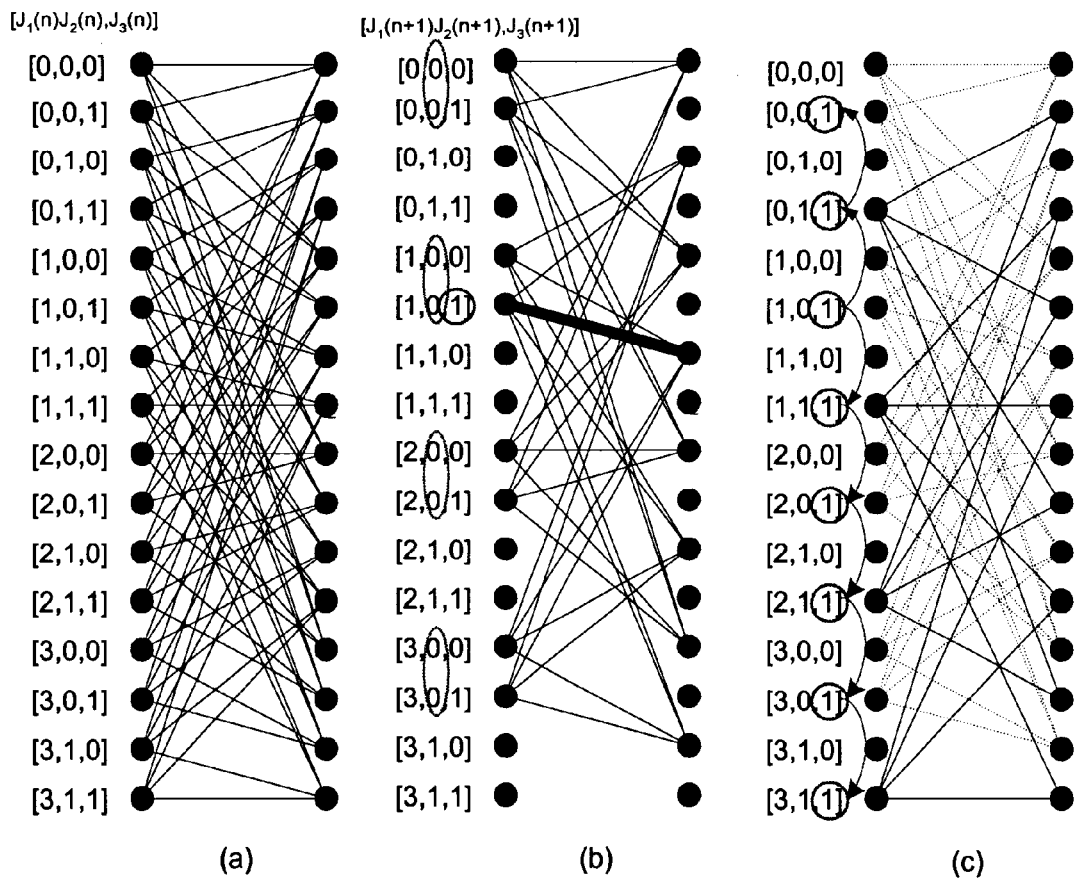
FIGS. 7A–7C show the trellis code determination in a Viterbi detector according to another embodiment of the present invention.
Figure 8:
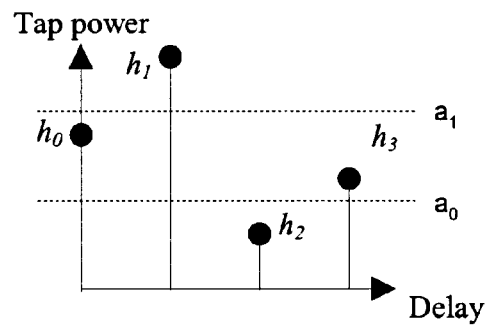
FIG. 8 shows a graph of another example of channel power distribution over time.

Considering the channel response in FIG. 8 with 4 taps and the set partitioning in FIG. 2, another example is shown in FIG. 7. For illustration purposes, it is assumed that the following symbols are transmitted: $[x_{n-3}, X_{n-2}, x_{n-1}, x_n] = [e^{j\pi/4}, e^{j\pi}, e^{j5\pi/4}, e^{j\pi/4}]$. Based on Procedure #2, the following steps are executed:

1. Decide the number of states: to facilitate clear presentation in limited space, $|J_1|$ is set to 4, which means the RSSE/SP has to make non-delayed decision of $x_n$ in each $J_1$ set. Further, $|J_2|=|J_3|=2$ without violating rules (D)–(F).
2. At t=n, $r_n$ is at the input of the equalizer and the cost function $E_n$ has to be calculated. Since the 3rd tap $h_2$ is below threshold $a_0$, only the paths corresponding to tentative decision on $x_{n-2}$ denoted by $\hat{x}_{n-2}$ (i.e., $\hat{J}_2=0$ in FIG. 7(b)) are applied. As mentioned above, the probability of successfully detecting $x_{n-3}$ does not rely heavily on $\hat{x}_{n-2}$ since $h_2$ is small.
3. Among all paths calculated in Step 2, the path with the smallest accumulated cost is selected (marked by a thick line in FIG. 7(b)). Based on this survivor path, it is tentatively decided $\hat{x}_{n-3}=e^{j\pi/4}$ (i.e., $\hat{J}_3(n)=1$). In addition to the paths calculated in Step 2, all paths originating from states with $\hat{J}_3(n)=1$ are calculated as shown in solid lines in FIG. 7(c). This step was mentioned before as "re-population".
4. Repeat steps 2 to 3 for the states in the next layer of trellis (i.e., t=n+1).

The computational effort is listed below in Table 1 as a function of $|X|$ and K. Complexity can be evaluated by (1) the number of path metric calculations, (2) the number of survivor calculations (number of comparisons to find out the survivor path for each terminating state), and (3) the number of path metric calculations to populate the trellis. The computational cost in the categories (1) and (3) are combined in the first column since they both involve calculation of $E_n$.

TABLE 1

|          | Path Metrics | Survivor |
|----------|--------------|----------|
| VE       | $|X|^K$      | $|X|^{K-1}$ |
| DDFSE    | $|X|^\mu$    | $|X|^{\mu-1}$ |
| RSSE/SP  | $|X|^K / \prod_{m=1}^{K-1} 2^m$ | $|X|^{K-1} / \prod_{m=1}^{K-1} 2^m$ |
| TS-RSSE/SP | $|X|^\mu \leq \bullet \leq |X|^\mu / \prod_{m=1}^{\mu-1} 2^m$ | $|X|^{\mu-1} / \prod_{m=1}^{\mu-1} 2^m \leq \bullet \leq |X|^{K-1} / \prod_{m=1}^{K-1} 2^m$ |

The computational effort using the 8-PSK modulation for the 4-tap channel as shown in FIG. 8 is listed in Table 2 below. Table 2 shows that the TS-RSSE/SP requires more computation than a DDFSE, but less than the RSSE/SP and the VE.

TABLE 2

|            | Path Metrics | Survivor |
|------------|--------------|----------|
| VE         | 4096         | 512      |
| DDFSE      | 64           | 8        |
| RSSE/SP    | 64           | 16       |
| TS-RSSE/SP | 48           | 16       |

Many popular equalizers like the Viterbi Equalizer, the Delayed Decision Feedback Sequence Estimator, the Decision Feedback Estimator, and the Reduced State Sequence Estimator with Set Partitioning can be perceived as a special case of the TS-RSSE/SP. For example, when $|J_k|=|X|$ for $k=1,\ldots,K$ and $\mu=K$, the TS-RSSE/SP works like a standard Viterbi Equalizer. With $|J_k|=|X|$ for $k=1,\ldots,\mu$ and $|J_k|=1$ for $k=\mu+1,\ldots,K$ the TS-RSSE/SP works like a Delayed Decision Feedback Sequence Estimator. With $|J_k|=1$ for $k=1,\ldots,K$ the TS-RSSE/SP works like a Decision Feedback Estimator and with $\mu=K$ it works like a Reduced State Sequence Estimator with Set Partitioning without pre-filtering. Advantageously, the present invention provides better system performance and reduced computational complexity than with the individual prior art equalizers.

What is claimed is:

1. A method of determining a trellis for a Viterbi detector based on estimated channel energy comprising the steps of:

receiving a sequence of n symbols;

defining partitioned sets according to a decision tree structure;

determining a size of each set partitioning according to tap energy of the channel;

determining a reduced set of connection paths between the current layer and a destination layer in the trellis by:
determining a value of a most likely oldest partitioned set in a current layer; and
calculating branch metrics only for the current layers in the trellis in which the oldest partitioned set matches the determined value.

2. The method according to claim 1, wherein the step of determining the reduced set of connection paths comprises the steps of:

determining the value of one of the partitioned sets in the current layer according to the tap energy of the channel;

calculating branch metrics only for layers in which the determined value is matched for the respective partitioned set; and determining the most likely branch metric and thus determining the oldest partitioned set.

3. The method according to claim 2, where said steps are repeated for sequential symbols.

4. The method according to claim 1, wherein the decision tree is an Ungerboeck decision tree.

5. The method according to claim 1, wherein the step of determining the size of each set partitioning in a decision tree is dependent on the energy of the channel coefficients.

6. The method according to claim 5, wherein at least one threshold for the tap energy of the channel is defined and the tap energy relative to this threshold is used to determine the partitioned set within the current layers used for determining the value of the partitioned set.

7. The method according to claim 5, wherein the oldest partitioned set in the trellis is determined based on which additional connections are calculated to maintain the trellis structure.

8. An arrangement for determining a trellis from a sequence of n symbols in a Viterbi detector comprising:

means receiving a sequence of n symbols;

means for defining partitioned sets according to a decision tree structure;

means for determining size of each set partitioning according to tap energy of the channel;

means for determining a reduced set of connection paths between the current layer and a destination layer in the trellis including:
means for determining a value of a most likely oldest partitioned set in a current layer; and
means for calculating branch metrics only for the current layers in the trellis in which the oldest partitioned set matches the determined value.

9. The arrangement according to claim 8, further comprising means to analyze the channel coefficients for the received sequence.

10. The arrangement according to claim 9, wherein the means for determining the size of each partitioned set receive the analyzed channel coefficients.

11. The arrangement according to claim 10, wherein at least one threshold for the channel tap energy is defined and the tap energy relative to the threshold is used to determine the connection between the current and the destination layers in the trellis.

12. The arrangement according to claim 11, wherein the oldest partitioned set in the current layer is determined based on which additional connections are calculated to maintain the trellis structure.

13. The arrangement according to claim 8, wherein the arrangement comprises a digital signal processor.

* * * * *